(12) United States Patent
Lee et al.

(10) Patent No.: US 8,219,938 B2
(45) Date of Patent: Jul. 10, 2012

(54) SEMICONDUCTOR INTER-FIELD DOSE CORRECTION

(75) Inventors: Hyung-Rae Lee, Whasung (KR); Dong hee Yu, Whasung (KR); Len Y. Tsou, New City, NY (US); Haoren Zhuang, Hopewell Junction, NY (US)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 368 days.

(21) Appl. No.: 12/580,347

(22) Filed: Oct. 16, 2009

(65) Prior Publication Data
US 2011/0093823 A1   Apr. 21, 2011

(51) Int. Cl.
G06F 17/50   (2006.01)
(52) U.S. Cl. ......................................................... 716/50
(58) Field of Classification Search ...................... 716/50
See application file for complete search history.

(56) References Cited

U.S. PATENT DOCUMENTS

| | | | |
|---|---|---|---|
| 2005/0075819 A1* | 4/2005 | Paxton et al. | 702/117 |
| 2006/0183025 A1* | 8/2006 | Yang et al. | 430/5 |
| 2007/0114453 A1 | 5/2007 | Emi et al. | |
| 2010/0015537 A1* | 1/2010 | Emi et al. | 430/30 |
| 2011/0017926 A1* | 1/2011 | Lee et al. | 250/492.22 |

* cited by examiner

Primary Examiner — Thuan Do
Assistant Examiner — Magid Dimyan
(74) Attorney, Agent, or Firm — F. Chau & Associates, LLC

(57) ABSTRACT

A method and apparatus are provided for adapting a semiconductor inter-field dose correction map from a first photolithography mask to a second photolithography mask using the same manufacturing stack and reactive ion etching processes, the method including: obtaining a first dose correction map for the first photolithography mask as a function of first chip or die identities; determining a first transformation matrix from the first chip or die identities of the first photolithography mask into an orthogonal coordinate system; determining a second transformation matrix from second chip or die identities of the second photolithography mask into the orthogonal coordinate system; and transforming the first dose correction map for the first photolithography mask into a second dose correction map for the second photolithography mask in correspondence with each of the first and second transformation matrices.

20 Claims, 10 Drawing Sheets

SEMICONDUCTOR INTER-FIELD DOSE CORRECTION

BACKGROUND OF THE INVENTION

The present disclosure generally relates to semiconductor manufacturing and lithography methods. More particularly, the present disclosure relates to methods for inter-field dose mapping and correction in semiconductor wafers.

SUMMARY OF THE INVENTION

The present disclosure teaches the adaptation of a semiconductor inter-field dose correction map from a first photolithography mask to a second photolithography mask. Exemplary embodiments are provided.

An exemplary embodiment method is provided for adapting a semiconductor inter-field dose correction map from a first photolithography mask to a second photolithography mask using the same manufacturing stack and reactive ion etching processes, the method comprising: obtaining a first dose correction map for the first photolithography mask as a function of first chip or die identities; determining a first transformation matrix from the first chip or die identities of the first photolithography mask into an orthogonal coordinate system; determining a second transformation matrix from second chip or die identities of the second photolithography mask into the orthogonal coordinate system; and transforming the first dose correction map for the first photolithography mask into a second dose correction map for the second photolithography mask in correspondence with each of the first and second transformation matrices.

A further exemplary method provides that the orthogonal coordinate system is a two-dimensional Cartesian coordinate system. Another exemplary method provides that the orthogonal coordinate system is a three-dimensional polar coordinate system. Still another exemplary method provides that the origin of the orthogonal coordinate system is co-located on the center of one die in the first photolithography mask and on the center of another die in the second photolithography mask.

Another exemplary method provides that the second photolithography mask differs from the first photolithography mask in terms of at least one of die size, die location, or die orientation. Yet another exemplary method provides that the second photolithography mask defines a different number of dice per wafer than the first photolithography mask. Another exemplary method provides that the second photolithography mask defines a different critical dimension than the first photolithography mask. Still a further exemplary method provides that the second photolithography mask defines different mask sectors than the first photolithography mask. Another exemplary method provides that the second photolithography mask defines different field sizes than the first photolithography mask. Yet a further exemplary method provides that the second photolithography mask defines at least one of a different technology, geometry, or filter size than the first photolithography mask.

An exemplary embodiment computer-readable storage medium tangibly embodying a program of instructions executable by a computer to perform program steps is provided for adapting a semiconductor inter-field dose correction map from a first photolithography mask to a second photolithography mask using the same manufacturing stack and reactive ion etching processes, the program steps comprising: obtaining a first dose correction map for the first photolithography mask as a function of first chip or die identities; determining a first transformation matrix from the first chip or die identities of the first photolithography mask into an orthogonal coordinate system; determining a second transformation matrix from second chip or die identities of the second photolithography mask into the orthogonal coordinate system; and transforming the first dose correction map for the first photolithography mask into a second dose correction map for the second photolithography mask in correspondence with each of the first and second transformation matrices.

A further exemplary computer-readable storage medium provides that the orthogonal coordinate system is a two-dimensional Cartesian coordinate system. Another exemplary computer-readable storage medium provides that the orthogonal coordinate system is a three-dimensional polar coordinate system. Still another exemplary computer-readable storage medium provides that the origin of the orthogonal coordinate system is co-located on the center of one die in the first photolithography mask and on the center of another die in the second photolithography mask.

Another exemplary computer-readable storage medium provides that the second photolithography mask differs from the first photolithography mask in terms of at least one of die size, die location, or die orientation. Yet another exemplary computer-readable storage medium provides that the second photolithography mask defines a different number of dice per wafer than the first photolithography mask. Another exemplary computer-readable storage medium provides that the second photolithography mask defines a different critical dimension than the first photolithography mask. Still a further exemplary computer-readable storage medium provides that the second photolithography mask defines different mask sectors than the first photolithography mask. Another exemplary computer-readable storage medium provides that the second photolithography mask defines different field sizes than the first photolithography mask. Yet a further exemplary computer-readable storage medium provides that the second photolithography mask defines at least one of a different technology, geometry, or filter size than the first photolithography mask.

The present disclosure will be further understood from the following description of exemplary embodiments, which is to be read in connection with the accompanying drawings.

BRIEF DESCRIPTION OF THE DRAWINGS

The present disclosure provides a method for adapting a semiconductor inter-field dose correction map from a first photolithography mask to a second photolithography mask in accordance with the following exemplary figures, in which.

DETAILED DESCRIPTION OF PREFERRED EMBODIMENTS

The present disclosure provides a method to create general inter-field (i.e., wafer level) dose correction recipes for improving inter-field critical dimension (CD) uniformity among the chips or dice of a semiconductor wafer. Dose correction methods may be used to pre-compensate final CD non-uniformities driven by the same reactive ion etching (RIE) processes.

For example, the lead time to set up an initial dose map can be more than six (6) weeks. If there is a subsequent minor process change, such as a mask layout and/or mask size adjustment, it is desirable to reduce the time to set up the subsequent dose map. Methods of the present disclosure may be applied to automatically generate the subsequent dose map using a dose correction recipe when the stack and RIE processes remain unchanged.

A general inter-field dose correction recipe may be used for all processes that use the same stack and RIE process. Once an initial dose map is set up, there is no need to manually set up another dose map for any other product using the same RIE process.

The present disclosure recognizes that inter-field uniformity depends to a large extent on the dry-etch or RIE process. Dose mapping alone does not efficiently compensate for differences in semiconductors using different mask sectors or different field sizes. For example, minor changes for bulk or low power technologies and/or different filter sizes typically involve derivation of new dose mappings from scratch. The present disclosure shows that an existing dose map may be adapted from one technology to another or new one, as long as the same stack and RIE processes are maintained. Preferred embodiments account for different field sizes, and/or any other geometric technology differences.

Figure 1:
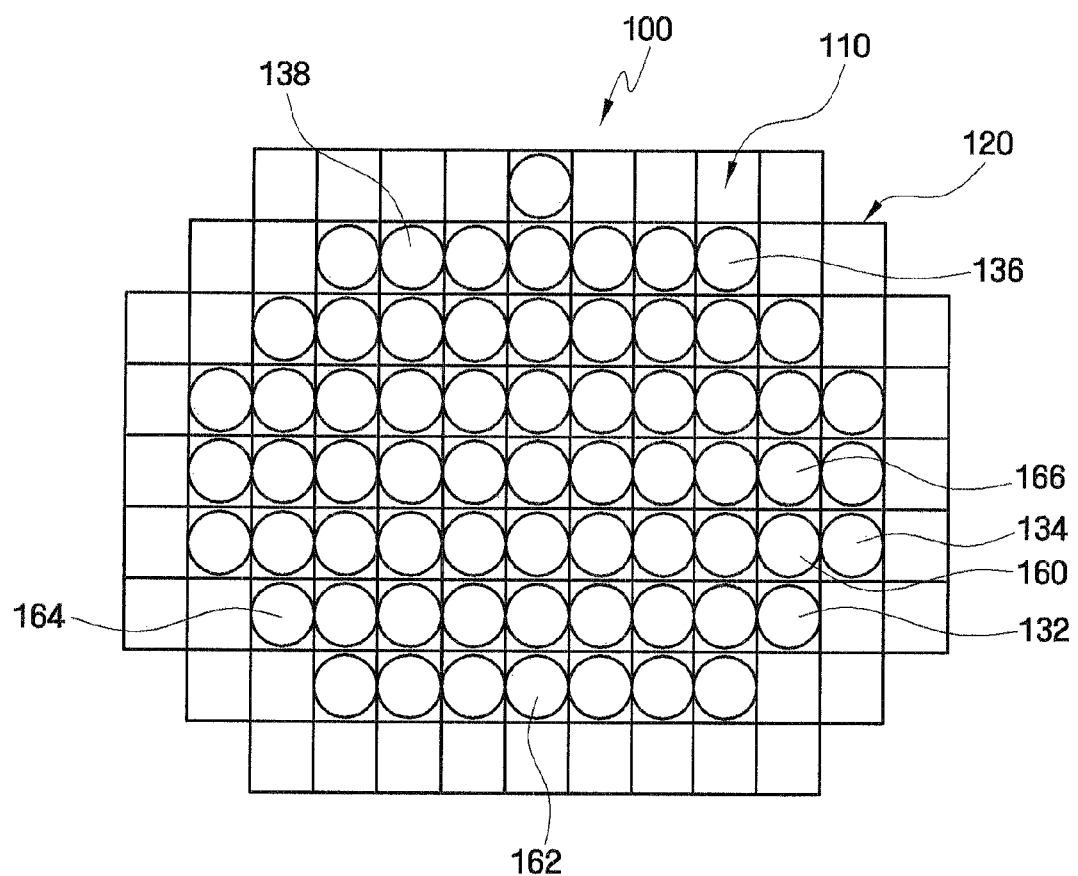
FIG. 1 shows a schematic graphical diagram of a semiconductor stack with a measured critical dimension for each die on a wafer in accordance with an exemplary embodiment of the present disclosure.

As shown in FIG. 1, a semiconductor stack is indicated generally by the reference numeral 100. The stack 100 includes a semiconductor wafer 110, a mask 120 disposed thereon, and a plurality of chip dice in the wafer 110 defined by the mask 120. In the particular stack shown, the measured critical dimension (CD) for the chip dice varies from about 73.50 nanometers (nm) to about 76.70 nm. In particular, at the tight end of the CD spectrum, chip dice 132 and 134 have measured CDs between about 73.50 nm and about 73.82 nm, and chip dice 136 and 138 have measured CDs between about 73.82 nm and about 74.14 nm. At the loose end of the CD spectrum, chip die 160 has a measured CD between about 75.74 nm and about 76.06 nm, chip dice 162 and 164 have measured CDs between about 76.06 nm and about 76.38 nm, and chip die 166 has a measured CD between about 76.38 nm and about 76.70 nm. The remainder of the chip dice have measured CDs between about 74.14 and about 75.74 nm.

Figure 2:
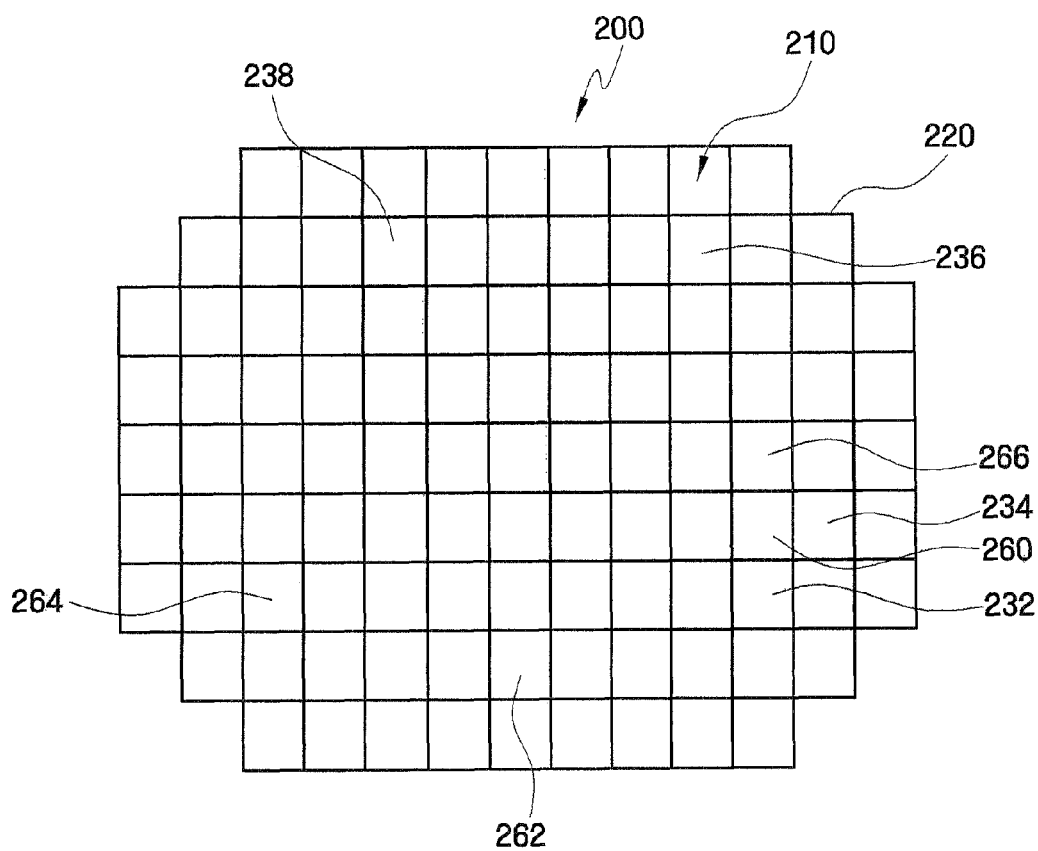
FIG. 2 shows a schematic graphical diagram of the semiconductor stack of FIG. 1 with a dose correction for each die on a wafer in accordance with an exemplary embodiment of the present disclosure.

Turning to FIG. 2, the semiconductor stack of FIG. 1 is indicated here by the reference numeral 200. The stack 200 includes a semiconductor wafer 210, a mask 220 disposed thereon, and a plurality of chip dice in the wafer 210 defined by the mask 220. In the particular stack shown, the dose correction for the chip dice varies from about negative 5.17 percent (%) to about positive 3.20%. In particular, at the negative end of the dose correction spectrum, chip dice 232, 234 and 236 receive dose corrections between about negative 5.17% and about negative 4.33%, and chip die 238 receives a dose correction between about negative 4.33% and about negative 3.49%. At the positive end of the dose correction spectrum, chip dice 260, 264 and 266 receive dose corrections between about positive 2.37% and about positive 3.20%, and chip die 262 receives a dose correction between about positive 1.53% and about positive 2.37%.

Thus, the dose correction method applies a dose offset per each field, which may be the field of the chip die but is not limited thereto, to compensate for the offset and/or variance of the final CD as driven by a given RIE process. Using this method, the statistical measure of variance known in the art as 3sigma CD uniformity has been improved from about 3.5 nm to about 2.0 nm for a representative semiconductor device.

Figure 3:
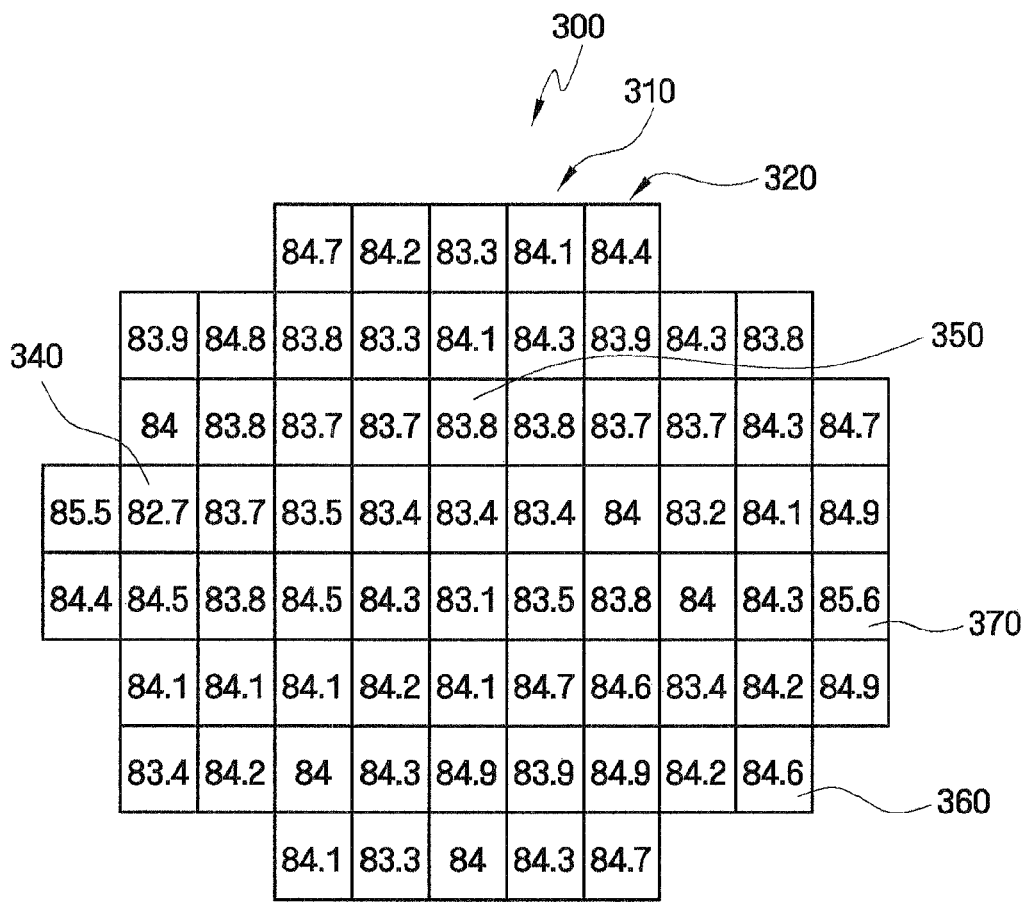
FIG. 3 shows a schematic hybrid diagram of a semiconductor stack with a measured critical dimension for each die on a wafer without dose correction after lithography.

Turning now to FIG. 3, a semiconductor stack without dose correction is shown after lithography and indicated generally by the reference numeral 300. The stack 300 includes a semiconductor wafer 310, a mask 320 disposed thereon, and a plurality of chip dice in the wafer 310 defined by the mask 320. In the particular stack shown, the measured CD for the chip dice varies from about 82.7 nm to about 85.6 nm. In particular, at the tight end of the CD spectrum, chip die 340 has a measured CD of about 82.7 nm. At the loose end of the CD spectrum, chip die 370 has a measured CD of about 85.6 nm. In the middle of the measured CD spectrum, chip die 350 has a measured CD of about 83.8 nm, and chip die 360 has a measured CD of about 84.6 nm. The 3sigma CD uniformity for this stack at this stage is 1.6 nm.

Figure 4:
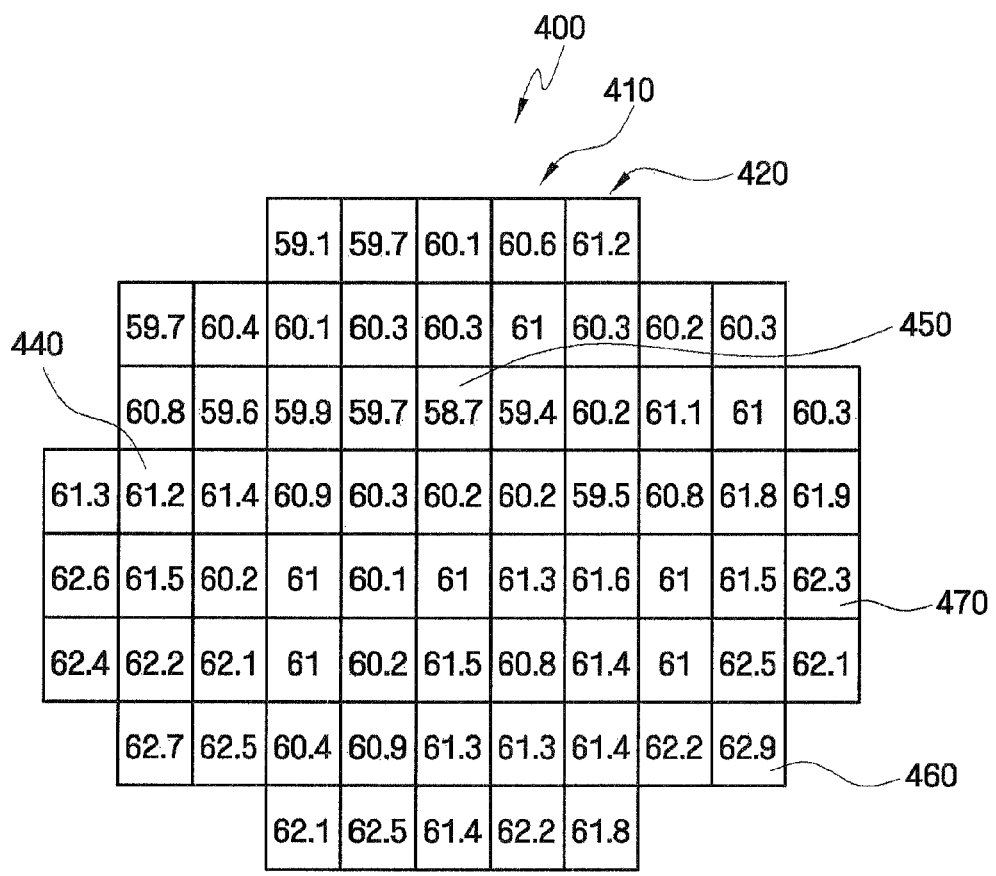
FIG. 4 shows a schematic hybrid diagram of the stack of FIG. 3 with a measured critical dimension for each die on a wafer at final CD.

As shown in FIG. 4, the stack of FIG. 3 is shown here at final CD and indicated generally by the reference numeral 400. The stack 400 includes a semiconductor wafer 410, a mask 420 disposed thereon, and a plurality of chip dice in the wafer 410 defined by the mask 420. In the particular stack shown, the measured CD for the chip dice varies from about 58.7 nm to about 62.9 nm. In particular, at the tight end of the CD spectrum, chip die 450 has a measured CD of about 58.7 nm. At the loose end of the CD spectrum, chip die 460 has a measured CD of about 62.9 nm. In the middle of the measured CD spectrum, chip die 440 has a measured CD of about 61.2 nm, and chip die 470 has a measured CD of about 62.3 nm. The 3sigma CD uniformity for this stack at this stage has now increased from 1.6 nm to 2.9 nm.

Figure 5:
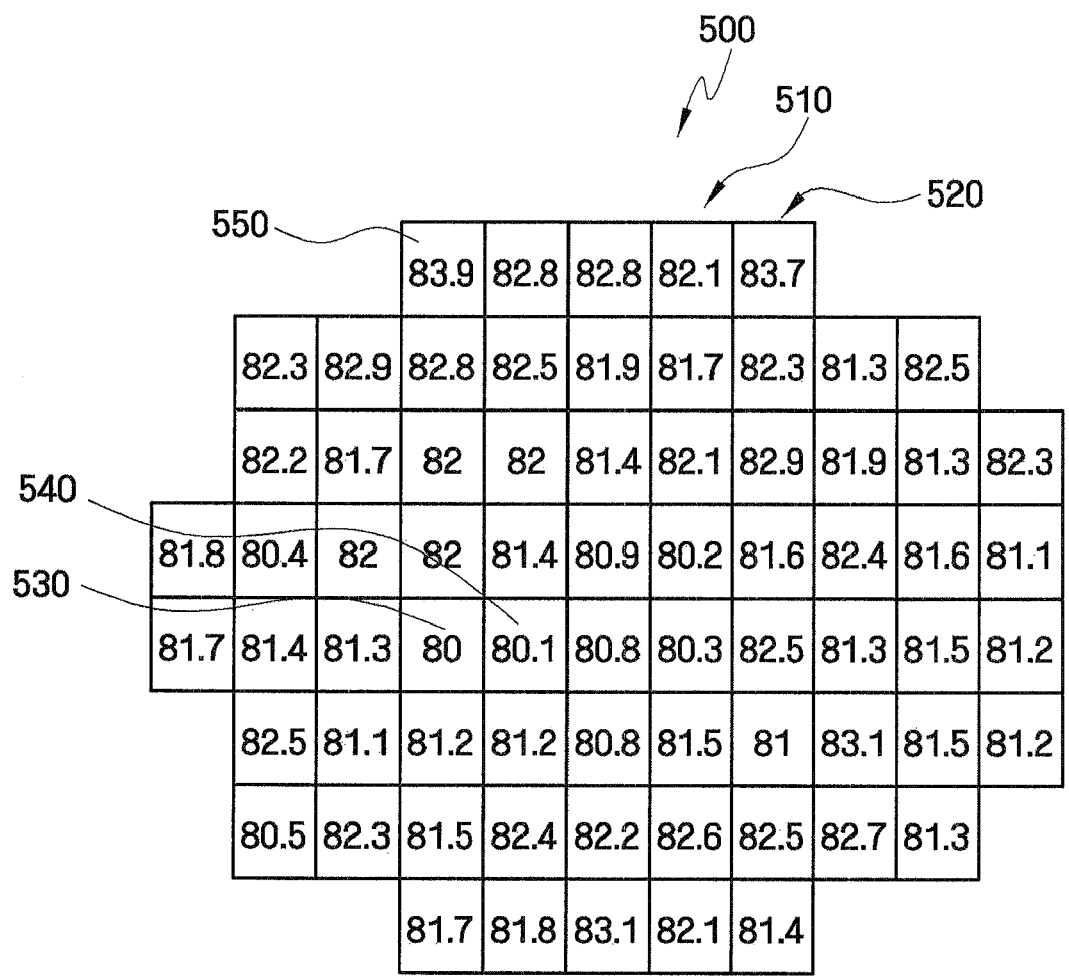
FIG. 5 shows a schematic hybrid diagram of a semiconductor stack with a measured critical dimension for each die on a wafer with dose correction in accordance with an exemplary embodiment of the present disclosure.

Turning to FIG. 5, a semiconductor stack with dose correction is shown after lithography and indicated generally by the reference numeral 500. The stack 500 includes a semiconductor wafer 510, a mask 520 disposed thereon, and a plurality of chip dice in the wafer 510 defined by the mask 520. In the particular stack shown, the measured CD for the chip dice varies from about 80.0 nm to about 83.9 nm. In particular, at the tight end of the CD spectrum, chip die 530 has a measured CD of about 80.0 nm, and chip die 540 has a measured CD of about 80.1 nm. At the loose end of the CD spectrum, chip die 550 has a measured CD of about 83.9 nm. The 3sigma CD uniformity for this stack at this stage is 2.4 nm. It shall be understood that the 3sigma CD uniformity may well be worse at this non-final stage for a dose corrected stack than for a stack without dose correction, such as that of FIG. 3. However, it is the final CD uniformity that matters most.

Figure 6:
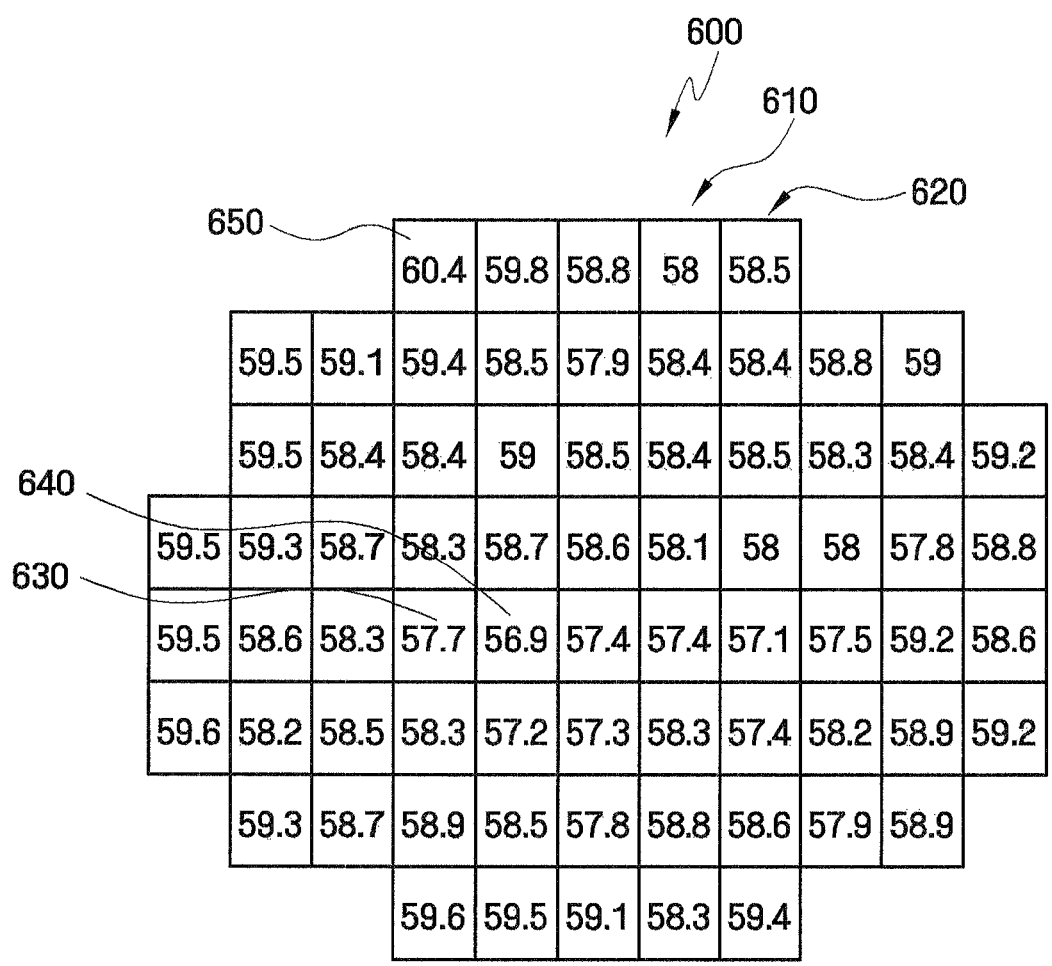
FIG. 6 shows a schematic hybrid diagram of the stack of FIG. 5 with a measured critical dimension for each die on a wafer at final CD in accordance with an exemplary embodiment of the present disclosure.

Turning now to FIG. 6, the stack of FIG. 5 is shown here at final CD and indicated generally by the reference numeral 600. The stack 600 includes a semiconductor wafer 610, a mask 620 disposed thereon, and a plurality of chip dice in the wafer 610 defined by the mask 620. In the particular stack shown, the measured CD for the chip dice varies from about 56.9 nm to about 60.4 nm. In particular, at the tight end of the CD spectrum, chip die 640 has a measured CD of about 56.9 nm. At the loose end of the CD spectrum, chip die 650 has a measured CD of about 60.4 nm. Chip die 630 has a measured CD of about 57.7 nm. The 3sigma CD uniformity for the stack with dose correction at this final stage has now decreased from 2.4 nm to 2.1 nm, which is a significant improvement over that of the stack without dose correction of FIG. 4. Thus, inter-field dose correction yields improved CD uniformity by the final step.

Figure 7:
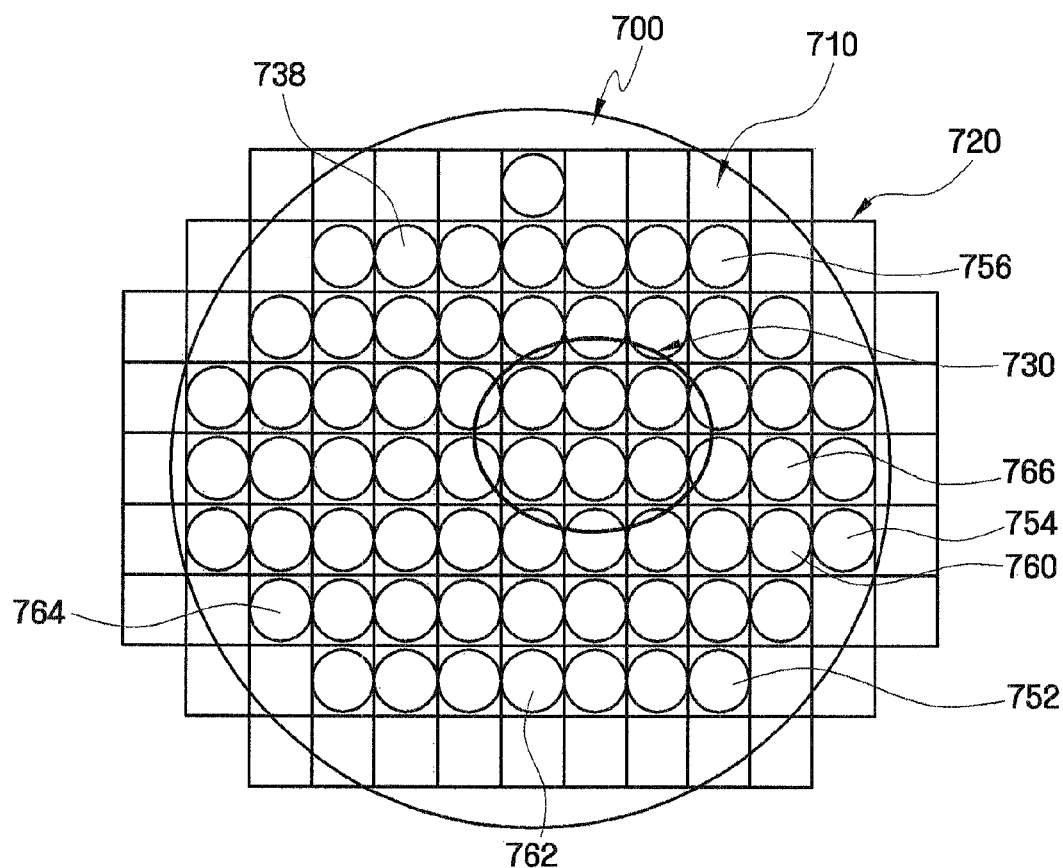
FIG. 7 shows a schematic graphical diagram of a semiconductor stack having initial dose mapping with a measured critical dimension for each die on a wafer in accordance with an exemplary embodiment of the present disclosure.

As shown in FIG. 7, a semiconductor stack with initial dose mapping is indicated generally by the reference numeral 700. The stack 700 includes a semiconductor wafer 710, a mask 720 disposed thereon, and a plurality of chip dice in the wafer 710 defined by the mask 720. In the particular stack shown, the measured CD for the chip dice varies from about 73.50 nm to about 76.70 nm. For example, a representative group of six adjacent dice 730 have measured CDs between about 74.46 nm and about 75.74 nm. At the tight end of the CD spectrum, chip dice 732 and 734 have measured CDs between about 73.50 nm and about 73.82 nm, and chip dice 736 and 738 have measured CDs between about 73.82 nm and about 74.14 nm. At the loose end of the CD spectrum, chip die 760 has a measured CD between about 75.74 nm and about 76.06 nm, chip dice 762 and 764 have measured CDs between about 76.06 nm and about 76.38 nm, and chip die 766 has a measured CD between about 76.38 nm and about 76.70 nm. The remainder of the chip dice have measured CDs between about 74.14 and about 75.74 nm.

Figure 8:
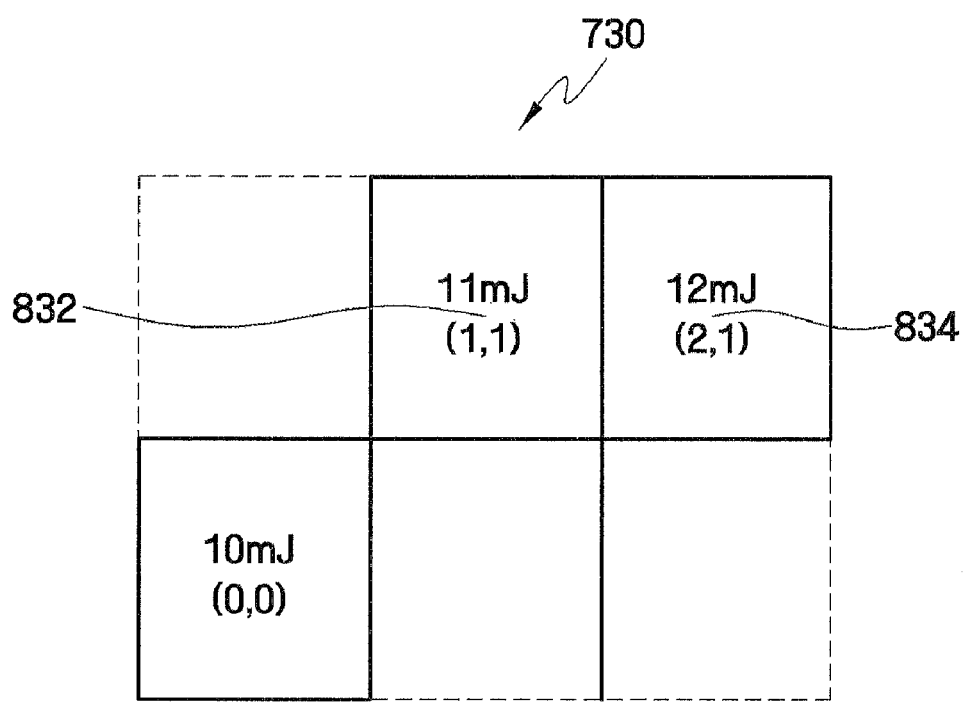
FIG. 8 shows a schematic hybrid diagram of a representative group of six adjacent dice of FIG. 7 in accordance with an exemplary embodiment of the present disclosure.

Turning to FIG. 8, the representative group of six adjacent dice 730 of FIG. 7 is illustrated in greater detail. These six adjacent dice happen to be arranged in a 2×3 matrix, and have measured CDs between about 74.46 nm and about 75.74 nm. Here, the chip die 10$mj$(0,0), which is at the lower left corner of the 2×3 matrix, has a measured CD of about 75.4 nm, the chip die 11$mj$(1,1), which is at the upper middle of the 2×3 matrix, has a measured CD of about 75.1 nm, and the chip die 12$mj$(2,1), which is at the upper right corner of the 2×3 matrix, has a measured CD of about 74.8 nm. The center of the die 11$mj$(1,1) is indicated by the reference numeral 832, and the center of the die 12$mj$(2,1) is indicated by the reference numeral 834.

In operation, the dose correction recipe may be updated in accordance with the present disclosure whenever there is a device change using the same stack and RIE process, or a wafer exposure map change using the same stack and RIE process. This obviates the need to create a new dose correction map from scratch. Thus, the general inter-field dose correction recipe may be applied whenever there is no change in the stack conditions or RIE processes.

Figure 9:
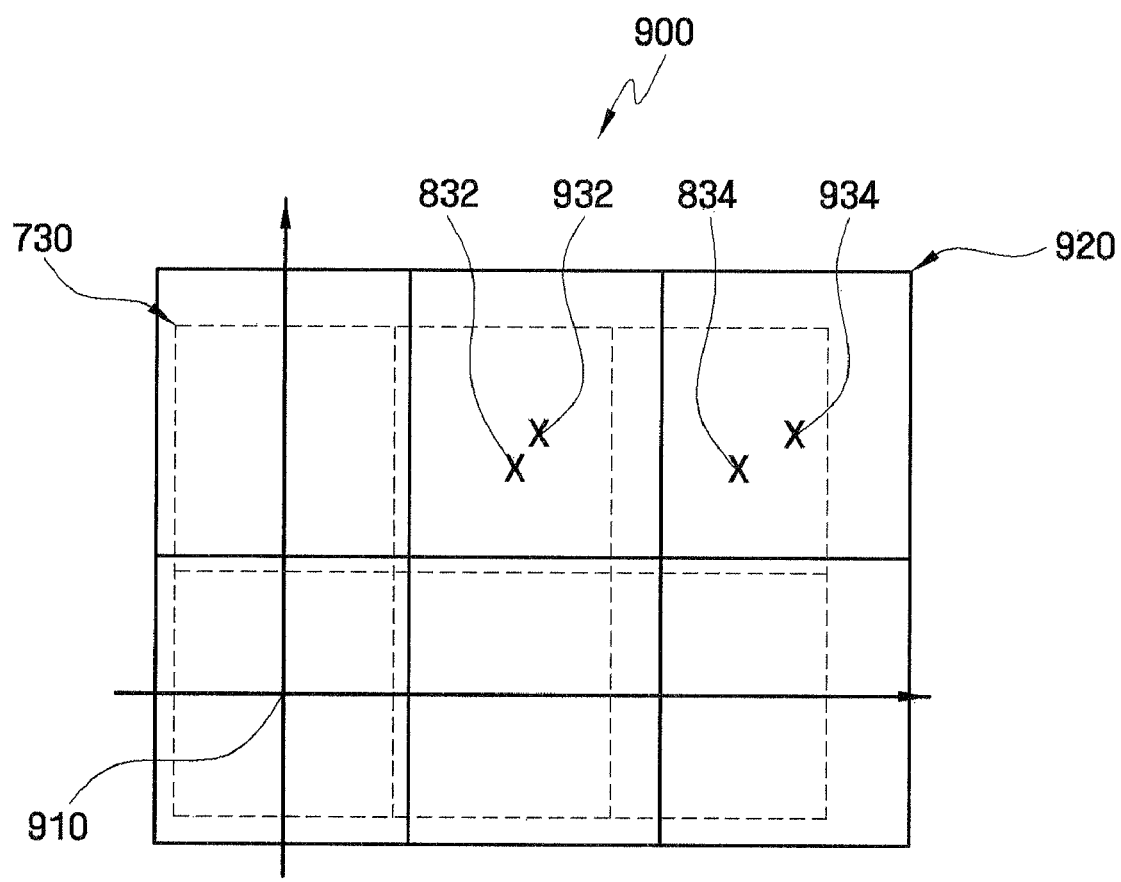
FIG. 9 shows a schematic hybrid diagram of a matrix transformation for a device and/or wafer exposure map change in accordance with an exemplary embodiment of the present disclosure.

Turning now to FIG. 9, a matrix transformation for a device and/or wafer exposure map change is indicated generally by the reference numeral 900. The transformation starts from an origin 910. An original dose map for the group of dice 730 of FIGS. 7 and 8 is shown overlaid with a new mask 920. Here, the origin 910 is shown at the center of the die 10$mj$(0,0) of FIG. 8. For convenience, a lower left die from the transformed matrix is also shown centered at the origin 910. The center of the die 11$mj$(1,1) of FIG. 8 is indicated here by the reference numeral 832, and the center of the die 12$mj$(2,1) of FIG. 8 is indicated here by the reference numeral 834. The new mask 920 is also represented by a 2×3 matrix, but this matrix has greater dimensions than that of the group 730. Thus, the upper middle die of the new mask has center 932, and the upper right die of the new mask has center 934.

In operation, a change in the device and/or mask size also changes the location of each chip. The general inter-field dose correction recipe may use Equation 1 to determine the changed chip location.

$$*f(\text{dose}) = f(\text{chip ID}) \tag{Eqn. 1}$$

If there is no change in the stack or RIE process, the general inter-field dose correction recipe may use Equation 2 to convert dose offset into a function of Cartesian coordinates.

$$f(\text{dose}) = f(\text{wafer\_x}, \text{wafer\_y}) \tag{Eqn. 2}$$

Other orthogonal coordinate systems may be used in alternate embodiments. For example, three-dimensional and/or polar coordinate transformation matrices may be used. Thus, the general inter-field dose correction recipe may be used for all devices that are using the same RIE process. For example, it may be used in combination with an advanced process control system featuring in-situ CD measurement, a beam dose computing method for mask writing processes, or other related technologies whether existing now or later developed.

The general inter-field dose correction recipe accurately handles pattern density differences for each setup. For example, exactly the same structure of Lpoly for pFET pattern may be used for a variety of devices. Lpoly is a preferred structure to obtain better electrical performance, such as in a 1:1 line-and-space 180 pitch pattern. In a preferred embodiment, the general inter-field dose correction recipe is embodied in a software algorithm implemented by a semiconductor manufacturing lithography system (e.g., ASML®).

Figure 10:
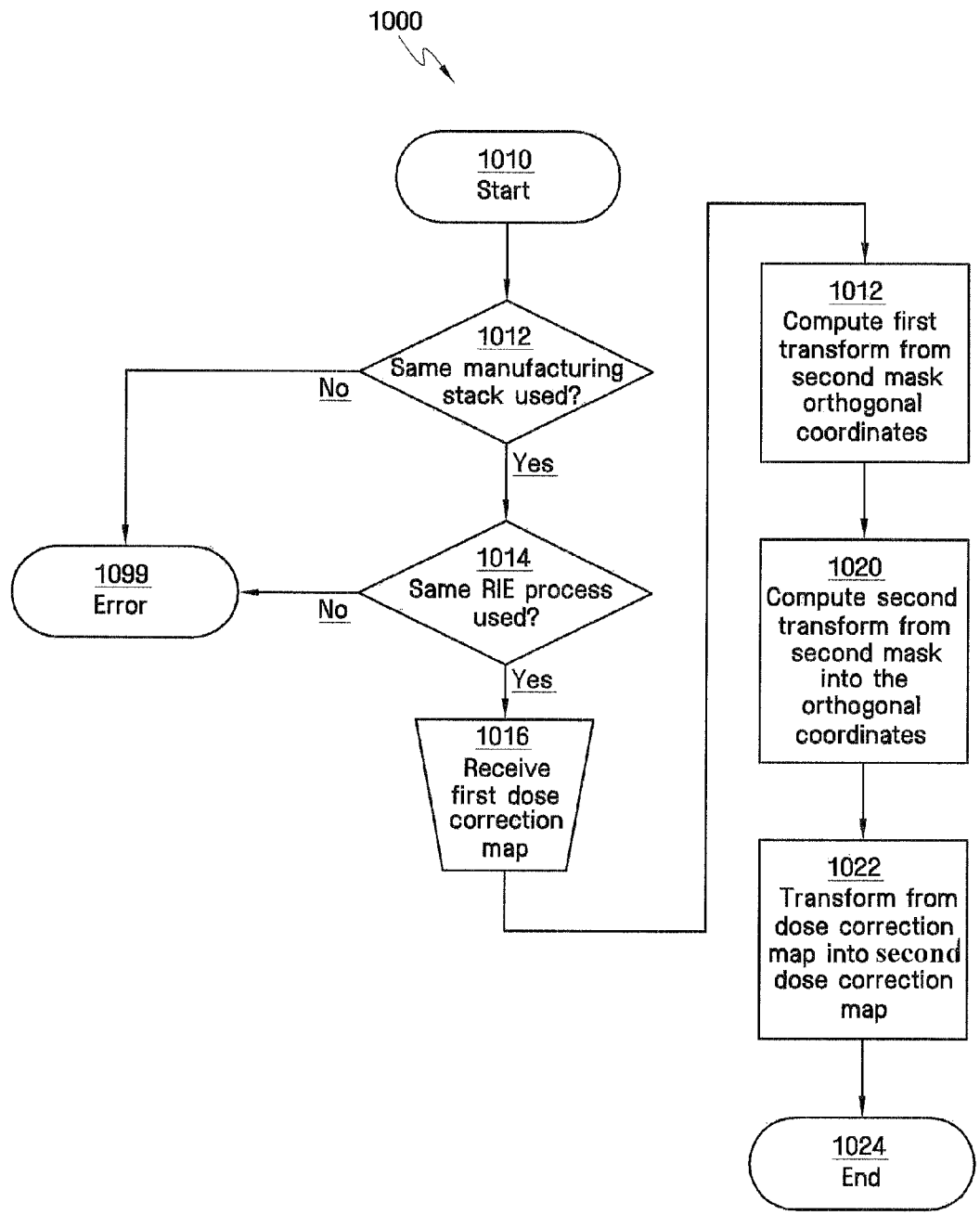
FIG. 10 shows a schematic flow diagram of a method for adapting a semiconductor inter-field dose correction map from a first photolithography mask to a second photolithography mask in accordance with an exemplary embodiment of the present disclosure.

As shown in FIG. 10, a method for adapting a semiconductor inter-field dose correction map from a first photolithography mask to a second photolithography mask is indicated generally by the reference numeral 1000. The method 1000 includes a start block 1010, which passes control to a decision block 1012. The decision block 1012 determines whether the same manufacturing stack is to be used. If not, control passes to an error block 1099, which ends and returns an error code. If so, control passes to another decision block 1014, which determines whether the same RIE process is to be used. If not, control passes to the error block 1099, which ends and returns an error code. If so, control passes to an input block 1016, which obtains a first dose correction map for the first photolithography mask as a function of first chip or die identities.

The input block 1016 passes control to a function block 1018, which determines a first transformation matrix from the first chip or die identities of the first photolithography mask into an orthogonal coordinate system, and passes control to a function block 1020. The function block 1020, in turn, determines a second transformation matrix from second chip or die identities of the second photolithography mask into the orthogonal coordinate system, and passes control to a function block 1022. The function block 1022 transforms the first dose correction map for the first photolithography mask into a second dose correction map for the second photolithography mask in correspondence with each of the first and second transformation matrices. For example, the function block 1022 may calculate matrix products for the first dose correction map times the first transformation matrix to from an intermediate result, and then calculate the matrix product of the intermediate result times the second transformation matrix to obtain the second dose correction map. Upon successful completion, the function block 1022 passes control to an end block 1024.

These and other features of the present disclosure may be readily ascertained by one of ordinary skill in the pertinent art based on the teachings herein. It is to be understood that the principles of the present disclosure may be implemented in various forms of hardware, software, firmware, special purpose processors, or combinations thereof.

Most preferably, the principles of the present disclosure are implemented as a combination of hardware and software. Moreover, the software is preferably implemented as an application program tangibly embodied in computer-readable storage media. The application program may be uploaded to, and executed by, a machine comprising any suitable architecture. Preferably, the machine is implemented on a computer platform having hardware such as one or more central processing units ("CPU"), a random access memory ("RAM"), and input/output ("I/O") interfaces. The computer platform may also include an operating system and microinstruction code. The various processes and functions described herein may be either part of the microinstruction code or part of the application program, or any combination thereof, which may be executed by a CPU. In addition, various other peripheral units may be connected to the computer platform such as an additional data storage unit, a printing unit, and a photolithography unit.

It is to be further understood that, because some of the constituent system components and methods depicted in the accompanying drawings are preferably implemented in software, the actual connections between the system components or the process function blocks may differ depending upon the manner in which the present invention is programmed. Given the teachings herein, one of ordinary skill in the pertinent art will be able to contemplate these and similar implementations or configurations of the present invention.

Although illustrative embodiments have been described herein with reference to the accompanying drawings, it is to be understood that the present disclosure is not limited to those precise embodiments, and that various other changes and modifications may be effected therein by those of ordinary skill in the pertinent art without departing from the scope or spirit of the present disclosure. All such changes and modifications are intended to be included within the scope of the present disclosure as set forth in the appended claims.

What is claimed is:

1. A method for generating a dose correction map, the method comprising:
    obtaining a first dose correction map for a first photolithography mask, the first dose correction map including a function of first chip or die identities;
    determining a first transformation matrix from the first chip or die identities of the first photolithography mask into an orthogonal coordinate system;
    determining a second transformation matrix from second chip or die identities of a second photolithography mask into the orthogonal coordinate system;
    performing a transformation on the first dose correction map for the first photolithography mask using the first and second transformation matrices; and
    generating a second dose correction map for the second photolithography mask using the transformed first does correction map for the first photolithography mask using a computer system,
    wherein the first photolithography mask uses a same manufacturing stack and reactive ion etching processes as the second photolithography mask but the second photolithography mask uses a different bulk or low power technology or a different filter size than what the first photolithography mask uses.

2. The method of claim 1 wherein the orthogonal coordinate system is a two-dimensional Cartesian coordinate system.

3. The method of claim 1 wherein the first and second transformation matrices are three-dimensional polar coordinate matrices.

4. The method of claim 1 wherein the origin of the orthogonal coordinate system is co-located on the center of one die in the first photolithography mask and on the center of another die in the second photolithography mask.

5. The method of claim 1 wherein the second photolithography mask differs from the first photolithography mask in terms of at least one of die size, die location, or die orientation.

6. The method of claim 1 wherein the second photolithography mask defines a different number of dice per wafer than the first photolithography mask.

7. The method of claim 1 wherein the second photolithography mask defines a different critical dimension than the first photolithography mask.

8. The method of claim 1 wherein the second photolithography mask defines different mask sectors than the first photolithography mask.

9. The method of claim 1 wherein the second photolithography mask defines different field sizes than the first photolithography mask.

10. The method of claim 1 wherein the second photolithography mask defines at least one of a different technology, geometry, or filter size than the first photolithography mask.

11. A non-transitory computer-readable storage medium tangibly embodying a program of instructions executable by a computer to perform program steps for generating a dose correction map, the program steps comprising:
    obtaining a first dose correction map for the first photolithography mask, the first dose correction map including a function of first chip or die identities;
    determining a first transformation matrix from the first chip or die identities of the first photolithography mask into an orthogonal coordinate system;
    determining a second transformation matrix from second chip or die identities of a second photolithography mask into the orthogonal coordinate system;
    performing a transformation on the first dose correction map for the first photolithography mask using the first and second transformation matrices; and
    generating a second dose correction map for the second photolithography mask from the transformed first does correction map for the first photolithography mask using a computer system,
    wherein the first photolithography mask uses a same manufacturing stack and reactive ion etching processes as the second photolithography mask but the second photolithography mask uses a different bulk or low power technology or a different filter size than what the first photolithography mask uses.

12. The computer-readable storage medium of claim 11 wherein the orthogonal coordinate system is a two-dimensional Cartesian coordinate system.

13. The computer-readable storage medium of claim 11 wherein the first and second transformation matrices are three-dimensional polar coordinate matrices.

14. The computer-readable storage medium of claim 11 wherein the origin of the orthogonal coordinate system is co-located on the center of one die in the first photolithography mask and on the center of another die in the second photolithography mask.

15. The computer-readable storage medium of claim 11 wherein the second photolithography mask differs from the first photolithography mask in terms of at least one of die size, die location, or die orientation.

16. The computer-readable storage medium of claim 11 wherein the second photolithography mask defines a different number of dice per wafer than the first photolithography mask.

17. The computer-readable storage medium of claim 11 wherein the second photolithography mask defines a different critical dimension than the first photolithography mask.

18. The computer-readable storage medium of claim 11 wherein the second photolithography mask defines different mask sectors than the first photolithography mask.

19. The computer-readable storage medium of claim 11 wherein the second photolithography mask defines different field sizes than the first photolithography mask.

20. The computer-readable storage medium of claim 11 wherein the second photolithography mask defines at least one of a different technology, geometry, or filter size than the first photolithography mask.

* * * * *